(12) United States Patent
Burd et al.

(10) Patent No.: US 6,965,652 B1
(45) Date of Patent: Nov. 15, 2005

US006965652B1

(54) ADDRESS GENERATOR FOR LDPC ENCODER AND DECODER AND METHOD THEREOF

(75) Inventors: Gregory Burd, San Jose, CA (US); Zining Wu, Los Altos, CA (US)

(73) Assignee: Marvell International Ltd., Hamilton (BM)

(*) Notice: Subject to any disclaimer, the term of this patent is extended or adjusted under 35 U.S.C. 154(b) by 783 days.

(21) Appl. No.: 09/730,597

(22) Filed: Dec. 7, 2000

Related U.S. Application Data

(60) Provisional application No. 60/214,781, filed on Jun. 28, 2000.

(51) Int. Cl.[7] ............................ H03D 1/00; H04L 27/06
(52) U.S. Cl. ........................................ 375/341; 714/752
(58) Field of Search ................... 375/341; 714/746–824

(56) References Cited

U.S. PATENT DOCUMENTS

| | | | | |
|---|---|---|---|---|
| 4,295,218 A | | 10/1981 | Tanner | 371/40 |
| 4,601,044 A | | 7/1986 | Kromer, III et al. | |
| 5,537,444 A | * | 7/1996 | Nill et al. | 375/341 |
| 5,757,821 A | | 5/1998 | Jamal et al. | 371/30 |
| 5,926,232 A | | 7/1999 | Mangold et al. | 348/845.1 |
| 5,930,272 A | | 7/1999 | Thesling | |
| 5,933,462 A | | 8/1999 | Viterbi et al. | 375/341 |
| 5,949,831 A | | 9/1999 | Coker et al. | |
| 5,974,540 A | | 10/1999 | Morikawa et al. | |
| 5,983,385 A | | 11/1999 | Khayrallah et al. | |
| 6,002,716 A | | 12/1999 | Meyer et al. | 375/231 |
| 6,009,549 A | | 12/1999 | Bliss et al. | 714/769 |
| 6,021,518 A | | 2/2000 | Pelz | 714/799 |
| 6,023,783 A | | 2/2000 | Divsalar et al. | |
| 6,028,728 A | | 2/2000 | Reed | 360/51 |
| 6,081,918 A | | 6/2000 | Spielman | 714/746 |
| 6,145,114 A | | 11/2000 | Crozier et al. | |
| 6,145,144 A | | 11/2000 | Poehlmann et al. | |
| 6,161,209 A | | 12/2000 | Moher | |
| 6,182,261 B1 | | 1/2001 | Haller et al. | |
| 6,219,817 B1 | | 4/2001 | Holman | |
| 6,427,220 B1 | | 7/2002 | Vityaev | |
| 6,438,180 B1 | | 8/2002 | Kavcic et al. | |
| 6,539,367 B1 | | 3/2003 | Blanksby et al. | |
| 6,581,181 B1 | | 6/2003 | Sonu | |
| 6,634,007 B1 | | 10/2003 | Koetter et al. | |
| 6,691,263 B2 | | 2/2004 | Vasic et al. | |
| 6,708,308 B2 | | 3/2004 | De Souza et al. | |
| 6,715,121 B1 | | 3/2004 | Laurent | |

FOREIGN PATENT DOCUMENTS

| | | |
|---|---|---|
| JP | 2004164767 | 10/2004 |
| WO | WO 96/37050 | 11/1996 |
| WO | WO 00/19616 A2 | 4/2000 |

OTHER PUBLICATIONS

U.S. Appl. No. 09/559,186, filed Apr. 27, 2000, Nazari et al.
U.S. Appl. No. 09/730,752, filed Dec. 7, 2000, Burd et al.
U.S. Appl. No. 09/730,603, filed Dec. 7, 2000, Wu et al.
U.S. Appl. No. 09/730,598, filed Dec. 7, 2000, Wu et al.
U.S. Appl. No. 09/730,598, filed Dec. 7, 2000, Burd et al.
U.S. Appl. No. 09/901,507, filed Jul. 9, 2001, Wu et al.

(Continued)

*Primary Examiner*—Stephen Chin
*Assistant Examiner*—Curtis Odom

(57) ABSTRACT

A data transmission system is provided for transmitting user data to and receiving data from a communication channel, comprising a first address generator to generate a first address in accordance with the user data. A linear block encoder encodes the user data in response to the first address from the first generator. A transmitter transmits an output of the linear block encoder to the communication channel, and a soft channel decoder to decode data. A second address generator generates a second address in accordance with the decoded data from the soft channel decoder, and a soft linear block code decoder decodes data decoded by the soft channel decoder in accordance with the second address from the second address generator.

86 Claims, 8 Drawing Sheets

OTHER PUBLICATIONS

"An Intuitive Justification and a Simplified Implementation of the MAP Decoder for Convolutional Codes", IEEE Journal On Selected Areas In Communications, vol. 16, No. 2, Feb. 1995, Andrew J. Viterbi.

"Good Error–Correcting Codes Based On Very Sparse Matrices", IEEE Transactions On Information Theory, vol. 45, No. 2, Mar. 1999, David J.C. MacKay.

"Low–Density Parity–Check Codes", Robert G. Gallager 1963.

"Coding And Iterative Detection For Magnetic Recording Channels", The Kluwer International Series In Engineering And Computer Science, Zining Wu.

Coding, Iterative Detection And Timing Recovery For Magnetic Recording Channels, A Dissertation, Zining Wu.

Shoemake and Heegard, "Computationally Efficient Turbo Decoding with Bi–Directional Viterbl Algorithm (BIVA)", IEEE, ISIT 1997.

L.H.C. Lee, "Computation of the Right–Inverse of G(D) and the Left–Inverse of H'(D)", Jun. 21, 1990, IEEE vol. 26, No. 13, pp. 904–906.

Oberg, Mats, et al., "Parity Check Codes for Partial Response Channel," IEEE Global Telecommunications Conference–Globecom '99, pp. 717–722, 1999.

Hagenauer, Joachim, et al., "A Viterbi Algorithm with Soft–Decision Outputs and its Application," IEEE Globecom '1990, pp. 1680–1686 (47.1.1–47.1.7), Nov. 1989.

* cited by examiner

ADDRESS GENERATOR FOR LDPC ENCODER AND DECODER AND METHOD THEREOF

CROSS REFERENCE TO RELATED APPLICATIONS

The present invention claims priority under 35 U.S.C. §119 (e) from U.S. provisional application Ser. No. 60/214781, entitled "Address Generator for LDPC Encoder and Decoder and Method Thereof," filed Jun. 28, 2000, the contents of which are incorporated herein by reference.

The present invention is related to the following commonly-assigned, copending applications:

"Multi-Mode Iterative Detector", filed on Apr. 27, 2000 and assigned application Ser. No. 09/559,186, the contents of which are incorporated herein by reference, "LDPC Encoder and Method Thereof", filed on even date and assigned application Ser. No. 09/730,752, the contents of which are incorporated herein by reference, "LDPC Decoder and Method Thereof", filed on even date and assigned application Ser. No. 09/730,603, the contents of which are incorporated herein by reference, and "Parity Check Matrix and Method of Forming Thereof", filed on even date and assigned application Ser. No. 09/730,598, the contents of which are incorporated herein by reference.

BACKGROUND OF THE INVENTION

1. Field of the Invention

The present invention relates generally to an address generator for providing addresses to a linear block encoder and decoder in a data transmission system. More particularly, the present invention relates to an address generator for providing addresses to a low density parity-check code (LDPC) encoder for a write channel and decoder for a read channel in a disk drive system.

2. Description of the Related Art

FIG. 1 illustrates a conventional digital data transmission system. As shown therein, a digital data transmission system comprises a transmitting section 300 for transmitting user data to receiver 500 via communication channel 401.

The operation of transmission section 300 will now be explained. Prior to processing by transmitting section 300, input or user data maybe encoded with an error correcting code, such as the Reed/Solomon code, or run length limited encoded (RLL) or a combination thereof by encoder 302. The encoded output encoder 302 is then interleaved by deinterleaver 308 for input to linear block code encoder 304 which generates parity data in a known manner utilizing linear block codes. One example of a linear block code is a low-density parity-check code (LDPC) which is discussed by Robert G. Gallager in *Low-Density Parity-Check Codes,* 1963, M.I.T. Press and by Zining Wu in *Coding and Iterative Detection For Magnetic Recording Channels,* 2000, Kluwer Academic Publishers, the contents of each of which are incorporated in their entirety by reference. Deinterleaver 308 permutes the data so that the same data is reordered before encoding by linear block code encoder 304. By permuting or redistributing the data, deinterleaver 308 attempts to reduce the number of nearest neighbors of small distance error events. User data at the output of encoder 302 is referred to as being in the channel domain; that is the order in which data is transmitted through the channel. The order of data processed by deinterleaver 308 is referred to as being in the linear block code domain. The parity data from linear block code encoder 304 is combined with the data encoded by encoder 302 by multiplexer 306 for input to channel transmitter 310.

Transmitter 310 transmits the combined user and parity data from multiplexer 306 typically as an analog signal over communication channel 401 in the channel domain. Communication channel 401 may include any wireless, wire, optical and the like communication medium. Receiver 500 comprises a front-end circuit 502 comprising analog to digital and equalization circuits. The digital signal front-end circuit 502 is input to soft channel decoder 504, which provides probability information of the detected data. Soft channel decoder 504 may be implemented by a Soft Viterbi Detector or the like. The output of the soft channel decoder 504, which is in the channel domain, is converted into the linear block code domain by deinterleaver 510. Deinterleaver 510 is constructed similarly to deinterleaver 308. Soft linear block code decoder 506 utilizes this information and the parity bits to decode the received data. One output of soft linear block code decoder 506 is fed back to soft channel decoder 504 via interleaver 512, which converts data in the linear block code domain to the channel domain. Interleaver 512 is constructed to perform the reverse operations of deinterleaver 510. Soft channel decoder 504 and soft linear block code decoder 506 operate in an iterative manner to decode the detected data.

The other output of soft linear block code decoder 506 is converted from the linear block domain to the channel domain by interleaver 514. Interleaver 514 is constructed similarly to interleaver 512. The output of interleaver 514 is passed on for further processing to decoder 508. Decoder 508 is implemented to perform the reverse operations of encoder 302.

FIG. 9 is an example of deinterleaver 308 (510) and an example of interleaver 514 (512). As shown therein, a codeword comprising bits b1, b2, b3, b4, b5 and b6 are input in time order of the first bit b1 to the last bit b6 to deinterleaver 308 (510). Deinterleaver 308 reorders the bit in accordance with the table below and outputs bit b3 first to the last bit b5 as the reordered codeword.

| Input bit order | Output bit order |
|---|---|
| 1 | 3 |
| 2 | 2 |
| 3 | 4 |
| 4 | 6 |
| 5 | 1 |
| 6 | 5 |

Interleaver 514 (512) performs the inverse operation of deinterleaver 308 (510). Interleaver 514 (512) takes, for example, the reordered codeword, bit b3 being first and bit b5 being last, and outputs a codeword in the original order, bit b1 being first and bit b6 being last, as shown in the table below.

| Input bit order | Output bit order |
|---|---|
| 3 | 1 |
| 2 | 2 |
| 4 | 3 |
| 6 | 4 |
| 1 | 5 |
| 5 | 6 |

The implementation of conventional interleaver described above is complicated and these circuits are difficult to design, especially when processing data blocks of the size of thousands of bits. Moreover, an interleaver (or deinterleaver) for processing 5000 bits requires a large look-up table (LUT) for performing the interleaving (deinterleaving) operations. Such conventional implementation requires approximately thousands of cycles, which is inconsistent with the requirements of ever increasing high data transfer rates. The linear block code encoder must have access to all bits in the same equation at one time. Memory structures such as SRAM are not efficient for access data required by the linear block encoder, and more expensive memory structures (in terms of fabrication cost, size and power consumption), such as registers and flip flops may be employed. As can be seen from FIG. 1, the conventional system requires additional circuitry for the two deinterleavers.

Another example of an interleaver is shown in FIG. 10.

The interleaver shown in FIG. 10 comprises a swap circuit 810 for swapping bits in accordance with a predefined table to assure that parity bits are not placed in inappropriate positions. The data is then shifted by shifting circuit 820, so that each of the code words is interleaved in a different manner. The output of which is then interleaved by inner interleave circuit 830, in which the size of the codewords corresponds to the size of the LDPC codewords. As such the interleaver is highly coupled to the parity-check matrix. As used herein the deinterleaver performs the inverse function as the interleaver. As will be appreciated by one of ordinary skill in the art, the term deinterleaver may be used for the term interleaver, so long as the term interleavcr is used for the term deinterleaver.

SUMMARY OF THE INVENTION

According to a first aspect of the invention, a data transmission system is provided for transmitting user data to and receiving data from a communication channel, comprising a first address generator to generate a first address in accordance with the user data. A linear block encoder encodes the user data in response to the first address from the first generator. A transmitter transmits an output of the linear block encoder to the communication channel, and a soft channel decoder to decode data. A second address generator generates a second address in accordance with the decoded data from the soft channel decoder, and a soft linear block code decoder decodes data decoded by the soft channel decoder in accordance with the second address from the second address generator.

According to a second aspect of the present invention, a decoder is provided for decoding data from a communication channel, comprising a soft channel decoder to decode data. A first address generator generates a first address in accordance with the decoded data from the soft channel decoder, and a soft linear block code decoder to decode data decoded by the soft channel decoder in accordance with the first address from the first address generator.

According to a third aspect of the present invention,an encoder is provided for encoding data from a communication channel, comprising a first address generator to generate a first address in accordance with the user data. A linear block encoder encodes the user data in response to the first address from the first generator, and a transmitter to transmit an output of the linear block encoder to the communication channel.

According to a fourth aspect of the present invention, a data transmission system is provided for transmitting user data to and receiving data from a communication channel, comprising first address generator means for generating a first address in accordance with the user data. Linear block encoding means encodes the user data in response to the first address from the first generator means, and transmitting means transmits an output of the linear block encoding means to the communication channel. Soft channel decoding means decodes data, and second address generator means generates a second address in accordance with the decoded data from the soft channel decoding means. Soft linear block code decoding means decodes data decoded by the soft channel decoding means in accordance with the second address from the second address generator means.

According to a fifth aspect of the present invention, a decoder is provided for for decoding data from a communication channel, comprising soft channel decoding means for decoding data. First address generator means generates a first address in accordance with the decoded data from the soft channel decoding means, and soft linear block code decoding means decodes data decoded by the soft channel decoding means in accordance with the first address from the first address generator means.

According to a sixth aspect of the present invention, an encoder is provided for encoding data from a communication channel, comprising first address generator means for generating a first address in accordance with the user data. Linear block encoding means encodes the user data in response to the first address from the first generator means, and transmitting means transmits an output of the linear block encoding means to the communication channel.

According to a seventh aspect of the present invention, a method is provided for transmitting data to and receiving data from a communication channel, comprising the steps of (a) generating an address in accordance with the data to be transmitted to the communication channel; (b) linear block encoding the data in accordance with the address generated in step (a); (c) transmitting the data encoded in step (b) to the communication channel; (d) receiving the data from to the communication channel; (e)

soft channel decoding the data read in step (d) in accordance with data decoded in step (g); (f) generating an address in accordance with the data soft linear block code decoding the data decoded in step (e); and (g) soft linear block code decoding data decoded by in step (e) in accordance with the address generated in step(f).

According to an eighth aspect of the present invention, a method is provided for decoding data received from a communication channel, comprising the steps of (a) soft channel decoding the data received in accordance with data decoded in step (c); (b)

generating an address in accordance with the data soft linear block code decoding the data decoded in step (a); and (c) soft linear block code decoding data decoded by in step (a) in accordance with the address generated in step(b).

According to a nineth aspect of the present invention, a method is provided for encoding data transmitted to a communication channel, comprising the steps of: (a) generating an address in accordance with the data to be transmitted to the communication channel; (b) linear block encoding the data in accordance with the address generated in step (a); and (c) transmitting the data encoded in step (b) to the communication channel.

According to a tenth aspect of the present invention, a computer program embodied in a medium is provided for transmitting data to and receiving data from a communication channel, comprising the steps of: (a) generating an address in accordance with the data to be transmitted to the communication; (b) linear block encoding the data in accordance with the address generated in step (a); (c) transmitting the data encoded in step (b) to the communication channel; (d) receiving the data from to the communication channel; (e) soft channel decoding the data read in step (d) in accordance with data decoded in step (g); (f) generating an address in accordance with the data soft linear block code decoding the data decoded in step (e); and (g) soft linear block code decoding data decoded by in step (e) in accordance with the address generated in step(f).

According to a eleventh aspect of the present invention, a computer program embodied in a medium is provided for decoding data received from a communication channel, comprising the steps of: (a) soft channel decoding the data received in accordance with data decoded in step (c); (b) generating an address in accordance with the data soft linear block code decoding the data decoded in step (a); and(c) soft linear block code decoding data decoded by in step (a) in accordance with the address generated in step(b).

According to a twelfth aspect of the present invention, a computer program embodied in a medium is provided for encoding data transmitted to a communication channel, comprising the steps of: (a) generating an address in accordance with the data to be transmitted to the communication channel; (b) linear block encoding the data in accordance with the address generated in step (a); and (c) transmitting the data encoded in step (b) to the communication channel.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
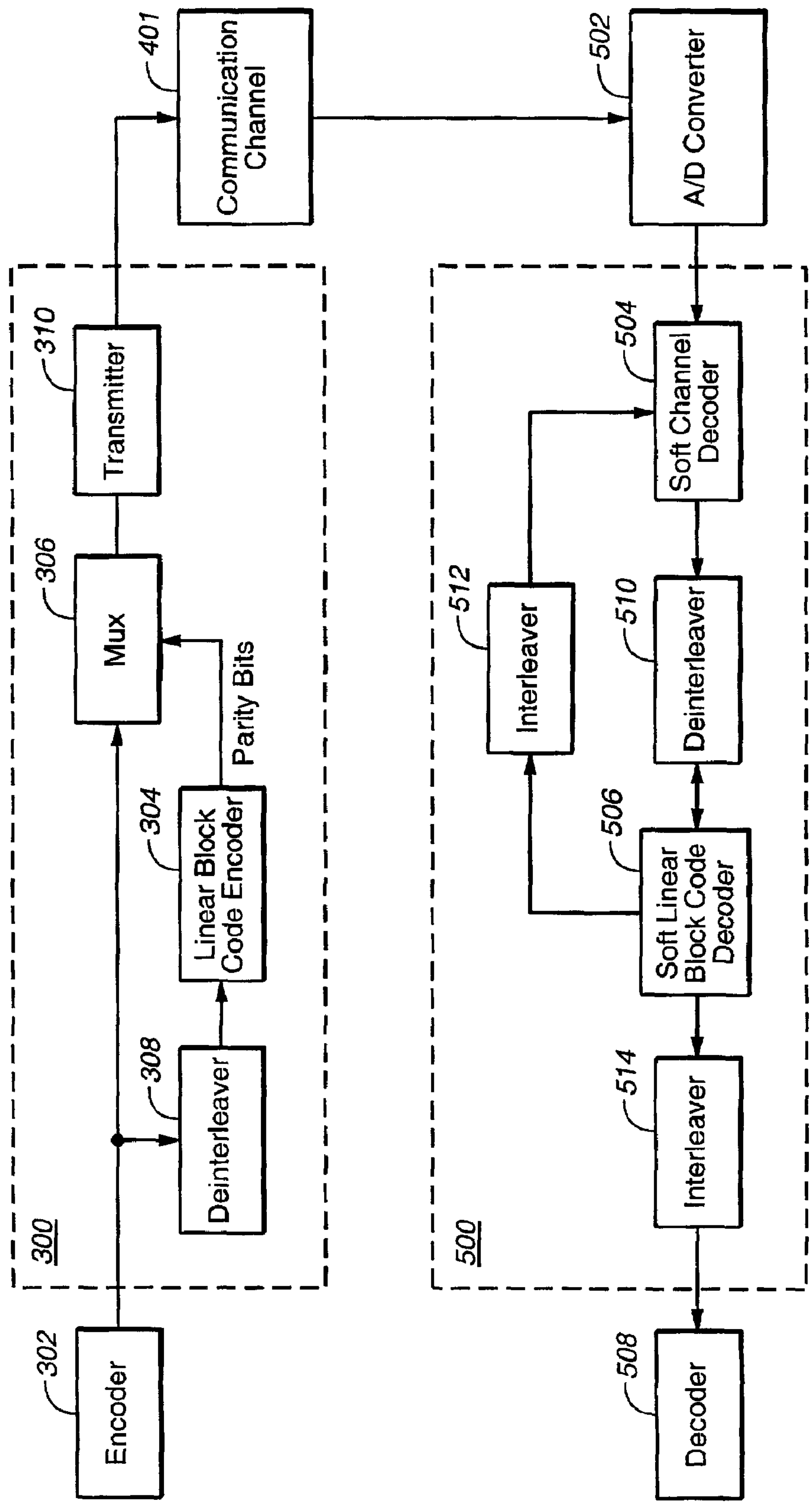
FIG. 1 is a block diagram of a conventional data transmission system.
Figure 2:
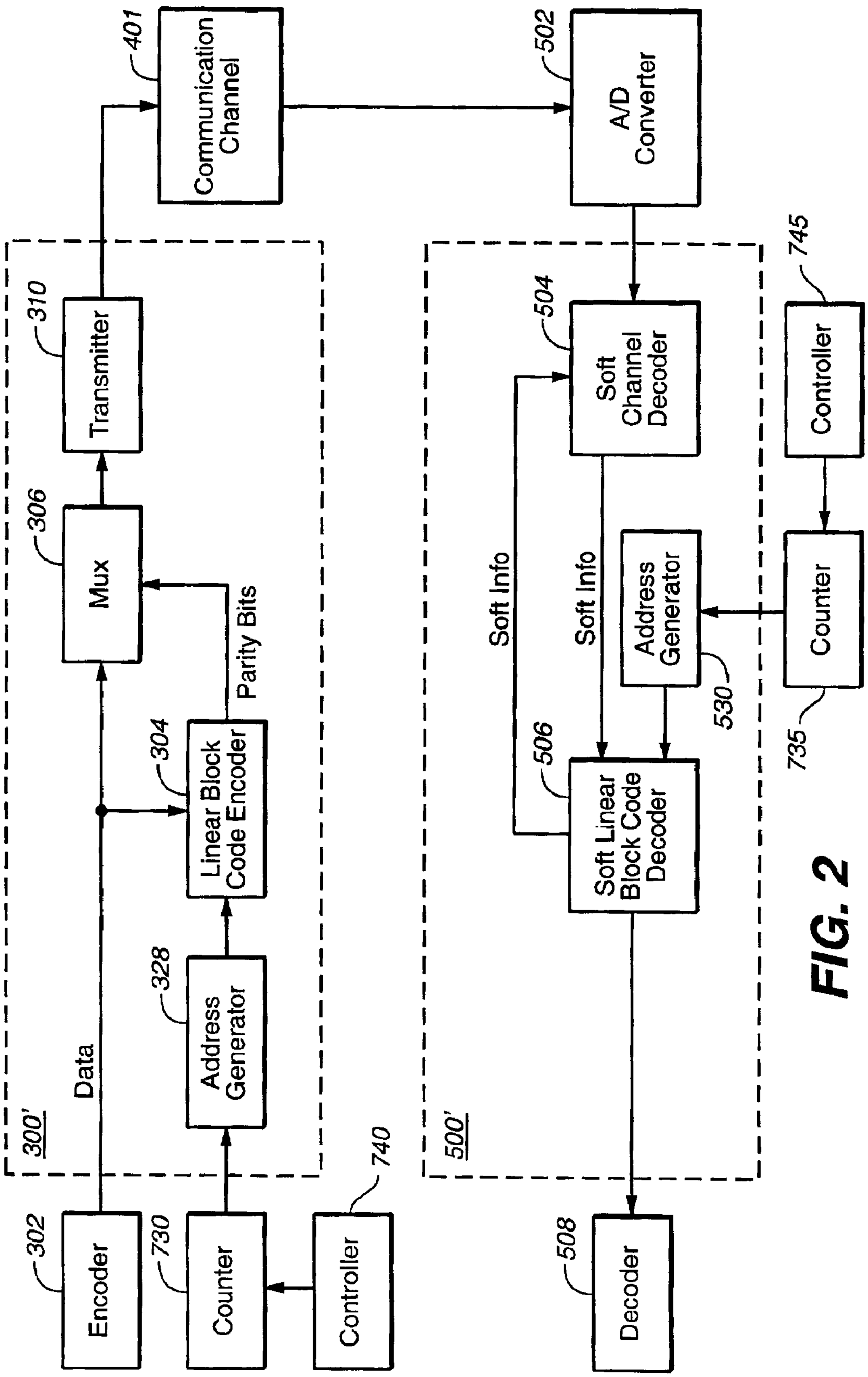
FIG. 2 is a block diagram of a data transmission system in accordance with the present invention.

Reference is now made to FIG. 2, which is a block diagram of a data transmission system in accordance with the present invention. In general as shown therein, a digital data transmission system comprises a transmitting section 300' for transmitting user data to receiver 500' via communication channel 401. The inventors have observed that a linear block code encoder is not dependent on a position of a bit interleaved. Rather the linear block code encoder only requires a list of equations for a given bit. In other words, there is no need to process the data in the order defined by the interleaver, instead data may be processed in the same order as it is written to the channel. This can be accomplished by incorporating an address generator to provide an address of the appropriate equation of the linear block code encoder. This principle can be similarly applied to the soft linear block decoder. As a result, deinterleaver 308 of the conventional system is now replaced by address generator 328, and deinterleaver 510 is now replaced by address generator 530. Accordingly, there is no requirement for the physical interleaving of data in the receiver 500', since the data remains in the same order as the order of bits of data in the channel throughout this system. The order of bits of data transmitted through the channel is referred to as the channel domain.

The operation of transmission section 300' will now be explained. Prior to processing by transmitting section 300', as in the conventional system, input or user data maybe encoded with an error correcting code, such as the Reed/Solomon code, or run length limited encoded (RLL) or a combination thereof by encoder 302. Addresses for the parity equations of linear block code encoder 304 are generated by address generator 328 in accordance with an index of the bits of data, the index being determined by address generator 328. Address generator 328 is responsive to counter 730 under the control of controller 740. Controller 740 synchronizes counter 730 to the output of encoder 302 so that counter 730 can provide a count of the number of bits in a codeword output by encoder 302 and a count of the number of codewords. In the preferred embodiment the data block size is 5000 bits.

Figure 3:
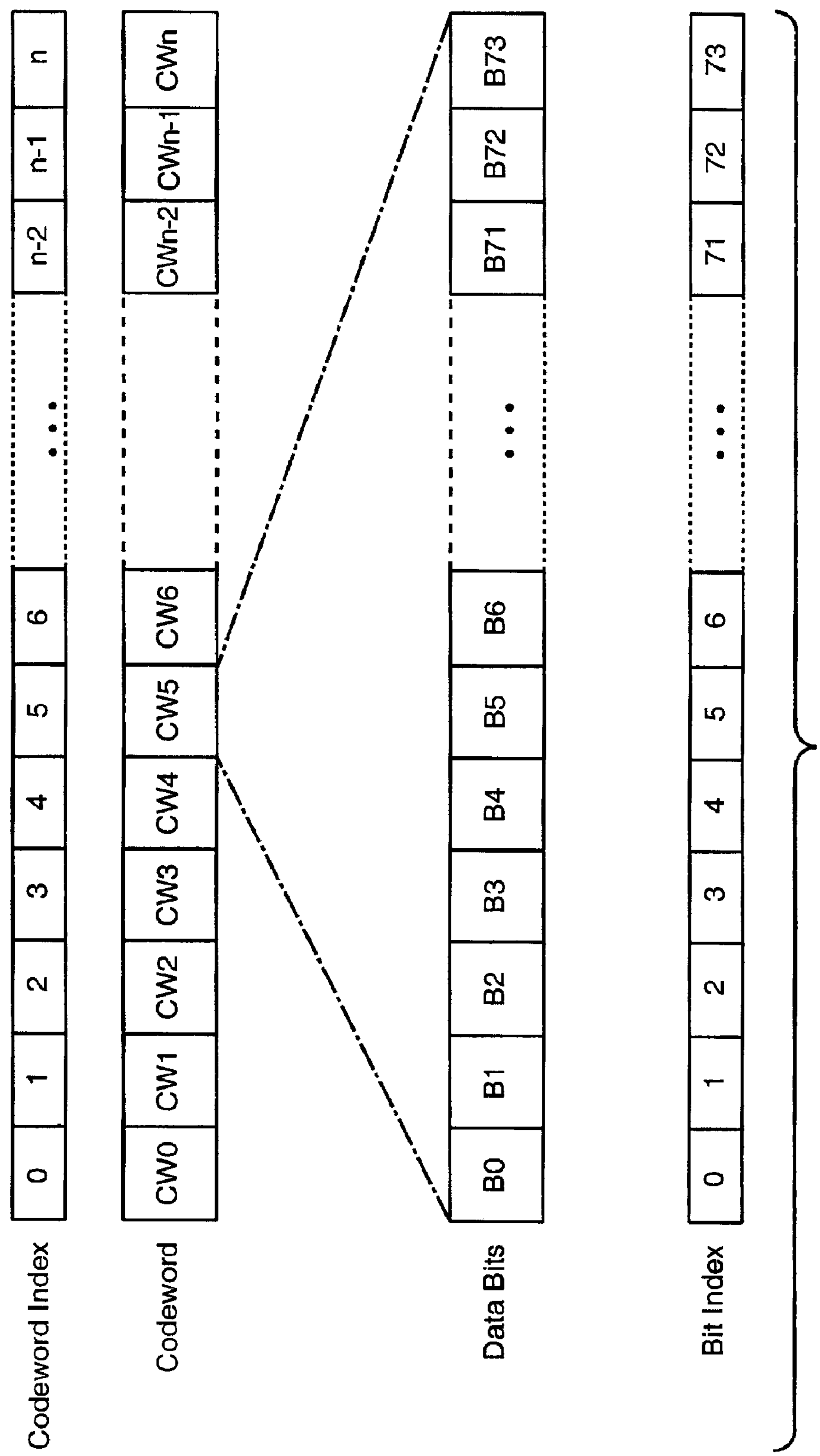
FIG. 3 is a diagram illustrating a block of user data and index thereof.

FIG. 3 illustrates the relationship between the user data and its index. As shown therein, user data consists of sequential codewords of data, each codeword consisting of n+1 bits of data, namely bits B0 through Bn, as input to transmission section 300. Preferably, each codeword consists of 74 bits of data. However it is possible for the last codeword of a sequence to be incomplete. Associated with each bit of data is a respective index 0-n or 0-73 in the preferred embodiment and a codeword index. The index represents the location of a bit within the codeword. The size of the codeword is determined in accordance with the design of the parity matrix and deinterleaver 770, as will be explained in detail hereinbelow.

Turning back to FIG. 2, linear block code encoder 304 utilizes the user data and address from address generator 328 to provide the parity bits to multiplexer 306. Linear block code encoder 304 is preferably implemented as a low-density parity-check code (LDPC) encoder as described in commonly assigned, copending patent application entitled "LDPC Encoder and Method Thereof", filed on even date and assigned application Ser. No. 09/730,752, the contents of which are incorporated herein by reference. The parity data from linear block code encoder 304 is combined with the data encoded by encoder 302 by multiplexer 306 for input to channel transmitter 310. In the preferred embodiment, the combined data consists of series of a pair parity bits followed by 40 bits of user data. This constraint is established by encoder 302.

Transmitter 310 transmits the combined user and parity data from multiplexer 306 typically as an analog signal over communication channel 401 in the channel domain. Communication channel 401 may include any wireless, wire, optical, magnetic and the like.

Receiver 500' comprises an analog to digital converter 502 to convert the data transmitted on communication channel 401 to a digital signal. The digital signal is input to soft channel decoder 504, which provides soft or probabilistic information of the detected data to soft linear block decoder 506. Soft channel decoder may be implemented as a Soft Viterbi Detector or the like, and address generator 530 may be constructed similarly as address generator 328 in transmission section 300'. The soft information output by soft channel decoder 504 remains in the channel domain and is a decoded by soft linear block code decoder 506, in accordance with the address of the parity equations generated by address generator 530. Address generator 530 is responsive to counter 735 under the control of controller 745. Controller 745 synchronizes counter 735 to the output of soft channel decoder 504 so that counter 830 can provide a count of the number of bits in a codeword output by soft channel decoder 504 and a count of the number of codewords.

Soft linear block code decoder 506 operates in combination with soft channel decoder 504 and address generator 530 in an iterative fashion. Soft linear block code decoder is preferably implemented as a low-density parity-check code (LDPC) decoder as described in commonly assigned, copending patent application entitled "LDPC Decoder and Method Thereof", filed on even date and assigned application Ser. No. 09/730,603, the contents of which are incorporated herein by reference. It is noted that since the soft information from soft channel decoder 504 to soft linear block code decoder 506 are both in the channel domain, thus as noted above, there is no need for any interleavers or deinterleavers in receiver 500'.

After the iterative process has completed, the output of soft linear block code decoder 506 is passed on for further processing to decoder 508. Decoder 508 is implemented to perform the reverse operations of encoder 302 or correct for any data errors.

Figure 6:
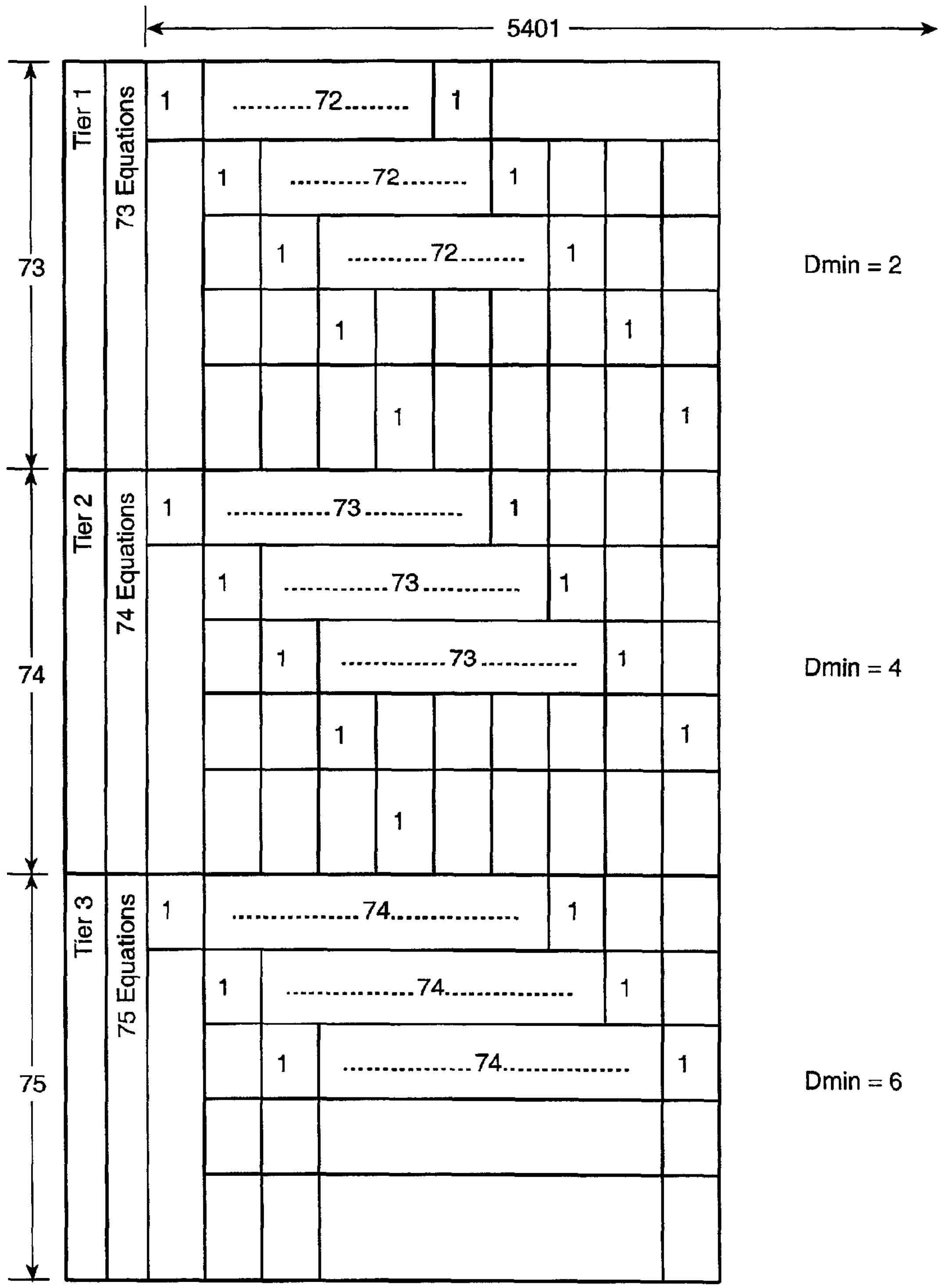
FIG. 6 is an example of a parity check matrix in accordance with the present invention.

Prior to discussing the construction and operation of the address generator, reference is now made to FIG. 6 for an explanation of the parity check matrix. The preferred matrix is 222 rows (or equations) by 5402 columns, which comprises 220 linearly independent rows (where 5402=73*74). The matrix can be divided into three tiers of equations having 73, 74 and 75 equations, respectively. The set of independent rows can be obtained by canceling the last row of the second tier and third tier, namely the $147^{th}$ row and the $222^{nd}$ row. As shown in FIG. 6, the following table shows the values of the elements in the matrix:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75) |

A matrix having 5402 columns can process a maximum LDPC codeword of 5402 bits. Of course, as will be appreciated by one of ordinary skill in the art, the matrix may be truncated to accommodate a smaller block, however the matrix must be at least 222×4366 which is dependent on the constraint of encoder 302. This constraint is for example a RLL constraint. The preferred matrix contains no cycles, since a matrix having cycles has degraded performance that degrades significantly. With the first tier only, the parity check matrix has a $D_{min}$=2; by adding the second tier, the parity check matrix has a $D_{min}$=4; and by adding the third tier, the parity check matrix has a $D_{min}$=6. A further description of the parity check matrix is provided in commonly assigned, copending application entitled, "Parity Check Matrix and Method of Designing Thereof", filed on even date and assigned application Ser. No. 09/730,598, the contents of which are incorporated herein by reference.

Figure 4:
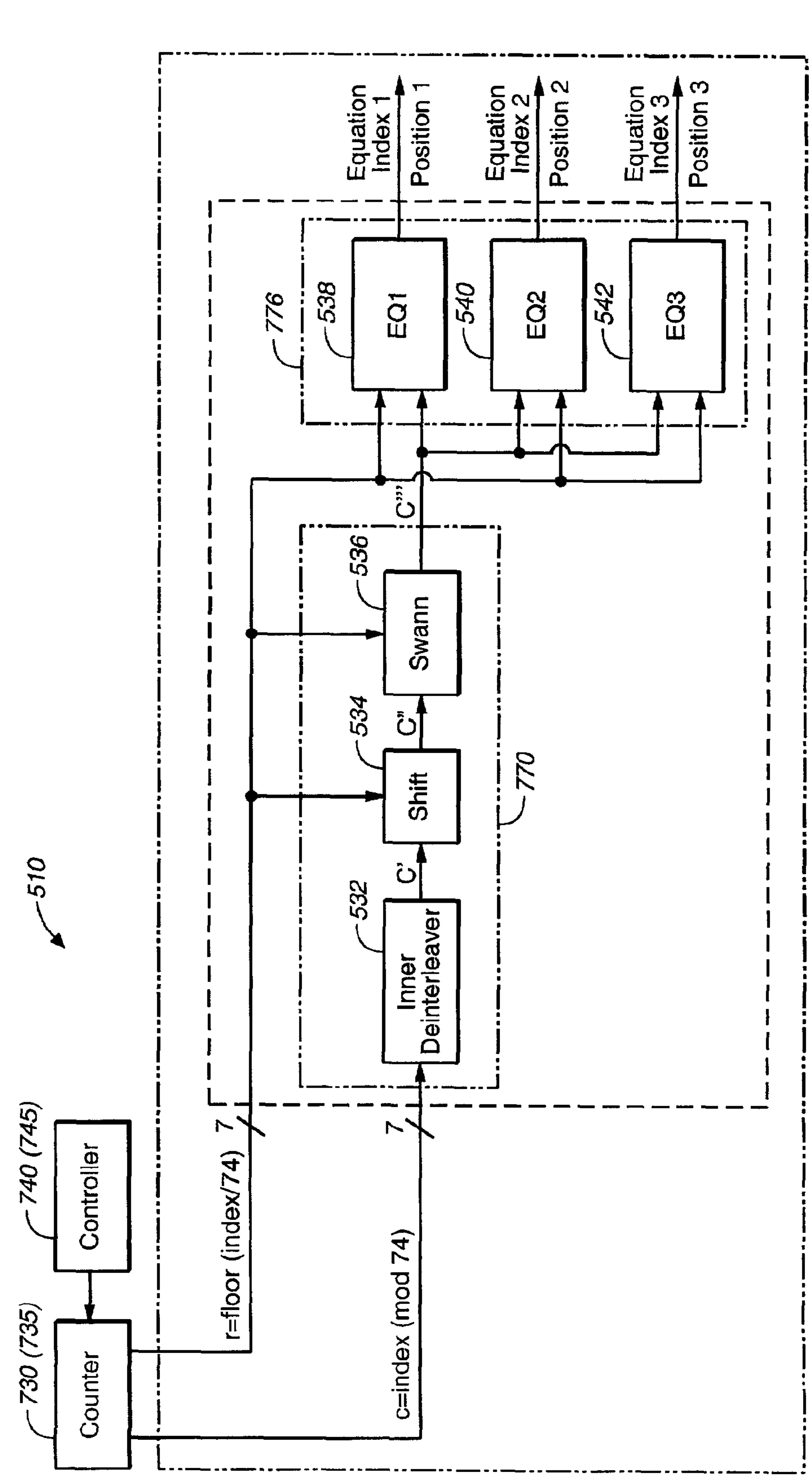
FIG. 4 is a block diagram of address generator in accordance with the present invention.
Figure 7:
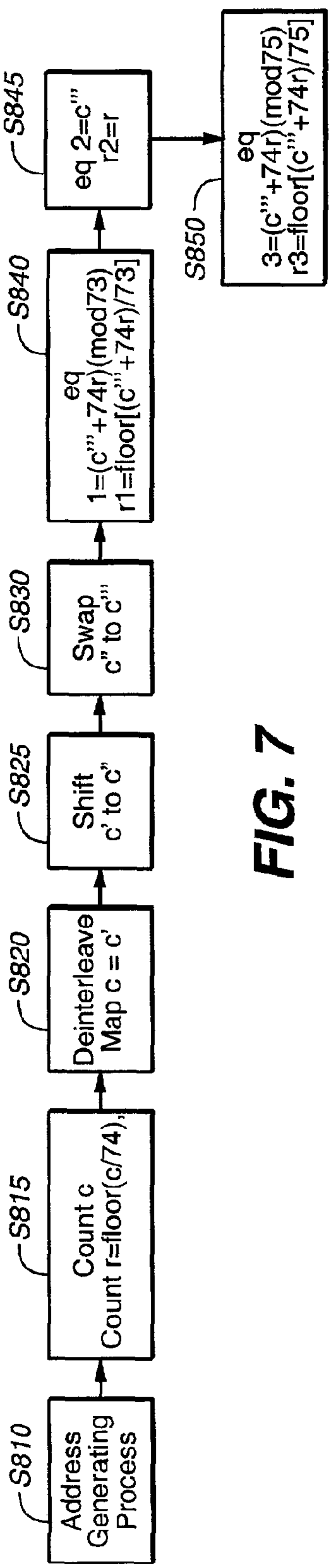
FIG. 7 is a flow chart of the method embodied by the address generator of FIG. 4.
Figure 9:
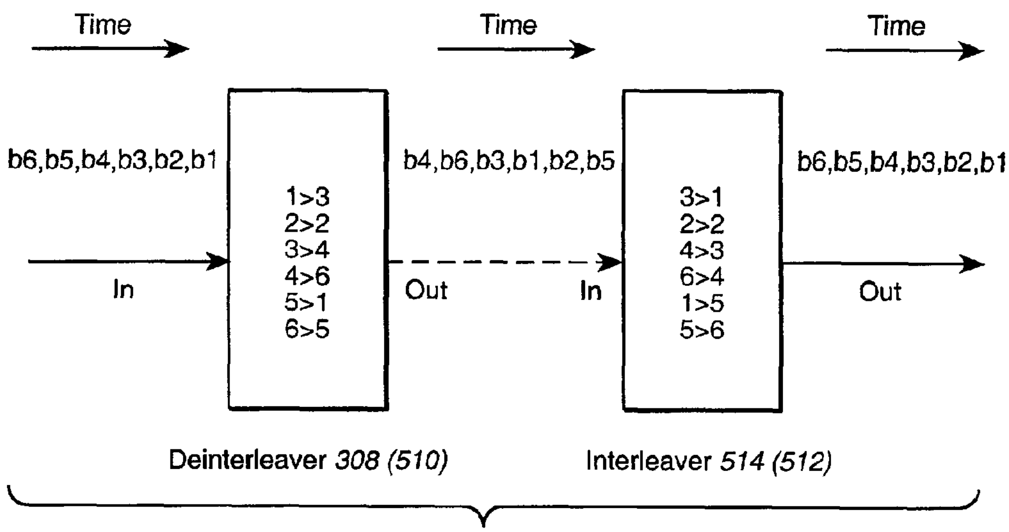
FIG. 9 is a block diagram of deinterleaver and interleaver.
Figure 10:
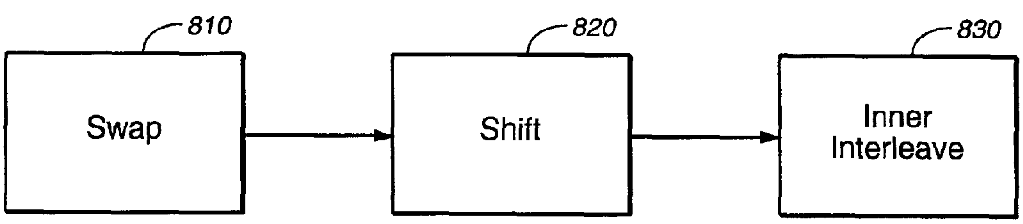
FIG. 10 is a block diagram of another interleaver.
Figure 11:
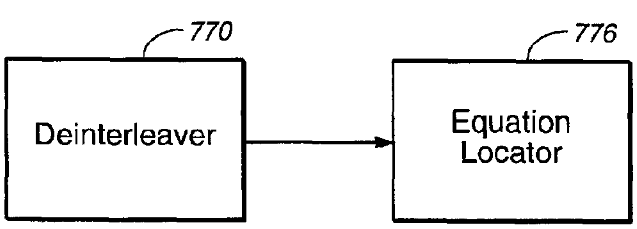
FIG. 11 is an overview block diagram of the address generator of FIG. 2.

FIG. 11 is an overview block diagram of address generator 328 (530), FIG. 4 is a detailed block diagram thereof and FIG. 7 is a flow chart of the method embodied therein. Address generator is design to perform the inverse of the interleaver shown in FIG. 9. The address generator in accordance with the present invention is highly coupled to the parity-check matrix.

As shown in FIG. 4, address generator 328 (530) comprises a deinterleaver 770 to deinterleave the indices of the codewords. In response to the deinterleaved codewords, equation locator 776 determines the corresponding party-check equation for either linear block code encoder 328 or soft linear block code decoder 506 to utilize. Referring to FIG. 4, deinterleaver 770 comprises inner deinterleaver 532, shift circuit 534 and swap circuit 536, and equation locator 776 comprises equation 1 circuit 538 equation 2 circuit 540, and equation 3 circuit 542.

Figure 8:
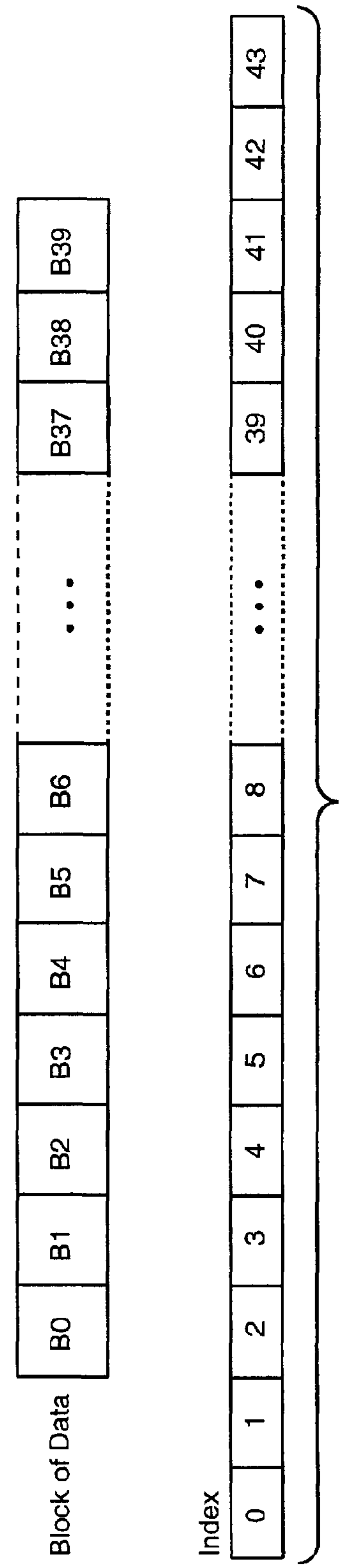
FIG. 8 is a diagram illustrating a block of user data and index thereof incorporating positions for parity bits.

Counter 730 (735), in response to controller 740 (745), counts the position of a bit within a codeword or value c from 0–n, where n=73 for a codeword having the size of 74 bits. Counter 730 (735), also counts the codeword or r=floor (c/74), where floor is defined as an integer operation (step s815). As noted above the size of the codeword is determined in accordance with the design of the parity matrix and deinterleaver 770. To simplify implementation, address generator 328 and address generator 530 are similarly constructed. It is noted that the data being counted by counter 730 (735), of address generator 328 does not include any parity bits since the parity bits are added after processing by the linear block decoder encoder 304. On the other hand, the data being counted by counter 730 (735), of address generator 530 contains parity bits. Therefore, counter 730 (735), in address generator 328, is arranged to count the data as if there were parity bits insert in the data. FIG. 8 illustrates a block of data containing 40 bits B0–B39. Also shown therein are the index numbers 0–43, index numbers 0, 1, 42 and 43 being counted as if the data contained parity bits.

Referring back to FIGS. 4 and 7, inner deinterleaver 532 maps c to c' in accordance with the Inner Deinterleaver Table below (step S820). In other words each value c is replaced by its corresponding value c'. For example for c=1, the value is replace by c'=9. As will be appreciated by one of ordinary skill in the art, both c and c' can have values between 0 and 73.

| | |
|---|---|
| 0 | 28 |
| 1 | 9 |
| 2 | 44 |
| 3 | 58 |
| 4 | 43 |
| 5 | 45 |
| 6 | 49 |
| 7 | 21 |
| 8 | 30 |
| 9 | 61 |
| 10 | 37 |
| 11 | 53 |
| 12 | 48 |
| 13 | 62 |
| 14 | 16 |
| 15 | 47 |

-continued

| | |
|---|---|
| 16 | 12 |
| 17 | 65 |
| 18 | 2 |
| 19 | 14 |
| 20 | 71 |
| 21 | 11 |
| 22 | 33 |
| 23 | 60 |
| 24 | 36 |
| 25 | 42 |
| 26 | 27 |
| 27 | 46 |
| 28 | 39 |
| 29 | 38 |
| 30 | 70 |
| 31 | 18 |
| 32 | 17 |
| 33 | 32 |
| 34 | 5 |
| 35 | 10 |
| 36 | 40 |
| 37 | 4 |
| 38 | 8 |
| 39 | 55 |
| 40 | 0 |
| 41 | 72 |
| 42 | 7 |
| 43 | 26 |
| 44 | 34 |
| 45 | 57 |
| 46 | 20 |
| 47 | 69 |
| 48 | 3 |
| 49 | 6 |
| 50 | 22 |
| 51 | 24 |
| 52 | 25 |
| 53 | 31 |
| 54 | 68 |
| 55 | 23 |
| 56 | 29 |
| 57 | 51 |
| 58 | 54 |
| 59 | 64 |
| 60 | 67 |
| 61 | 1 |
| 62 | 59 |
| 63 | 13 |
| 64 | 73 |
| 65 | 52 |
| 66 | 63 |
| 67 | 56 |
| 68 | 35 |
| 69 | 41 |
| 70 | 66 |
| 71 | 19 |
| 72 | 50 |
| 73 | 15 |

In response to inner deinterleaver 532 and the value r from counter 730 (735), the codeword number, the shift circuit shifts c' to c" by (c'–(72-r))(mod 74), 0≦r<72 (step S825). More specifically, the first interleaved codeword is circularly shifted 72 bits and the last interleaved codeword is shifted zero bits (in effect the last group is not shifted). Finally, bits c" are swapped into bits c'" by swap circuit 536 in accordance with the Swapping Table below (step S830). For example in interleaver codeword 39, bit 46 is swapped with bit 0 and bit 51 is swapped with bit 3. If a row or bit is not specified in the swapping table then there is no swapping in that row or there is no swapping of that bit.

Swapping Table

| | | bit | bit |
|---|---|---|---|
| interleaver codeword | 26 | 68 | 0 |
| interleaver codeword | 33 | 43 | 2 |
| interleaver codeword | 39 | 46 | 0 |
| | | 51 | 3 |
| interleaver codeword | 46 | 14 | 1 |
| | | 52 | 11 |
| interleaver codeword | 49 | 24 | 1 |
| interleaver codeword | 53 | 36 | 28 |
| | | 63 | 57 |
| interleaver codeword | 55 | 36 | 0 |
| interleaver codeword | 56 | 35 | 0 |
| interleaver codeword | 57 | 45 | 0 |
| interleaver codeword | 58 | 24 | 0 |
| | | 25 | 1 |

The output, c'", of swap circuit 536 and r of counter 730 (735), are processed by equation 1 circuit 538 (step S840), equation 2 circuit 540 (step S845), and equation 3 circuit 542 (step S850) to determine the equations in each of three tiers, respectively. Linear block code encoder 304 and soft linear block code decoder 506 utilize the results of these circuits. Additionally, soft linear block code decoder utilizes the value r to determine which bit index with in a parity check equation.

More particularly, the equation for tier 1=c'"+74r (mod 73), the equation for tier 2=c'"+74r (mod 74) and the equation for tier 3=c'"+74r (mod 75). As will be appreciated by one of ordinary skill in the art, since 74r is an integer multiple of 74, the equation for tier 2 is simply=c'". The position bit for tier 1 is floor((c'"+74r)/73), the position bit for tier 2 is floor((c'"+74r)/74) or simply r, and the position bit for tier 3 is floor((c'"+74r)/75). Again since the 74r is an integer multiple of 74 and 0≦c'"74, the bit position of tier 2 is simply r.

Figure 5:
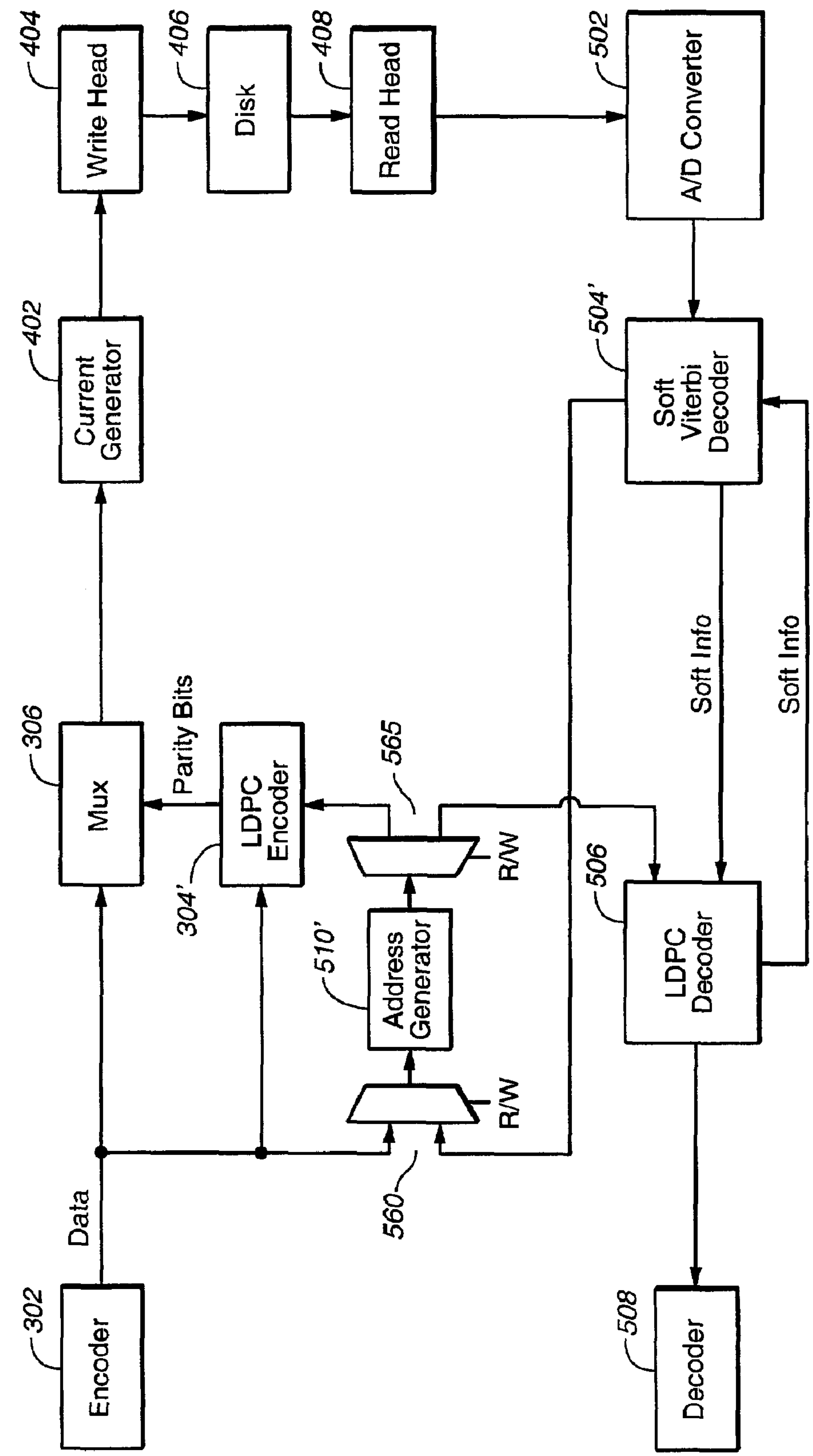
FIG. 5 is a block diagram of a read/write channel of disk drive incorporating the data transmission system of FIG. 2.

Reference is now made to FIG. 5. Shown therein is a block diagram of a read/write channel of disk drive incorporating the data transmission system of the preferred embodiment. Read/write channel comprises current generator 402 instead of transmitter 310 of FIG. 2. The channel comprises write head 404, disk 406 and read head 408. These components are well known and operate in a conventional manner. Therefore no further discussion is being presented. One characteristic of a read/write channel is that writing to and reading from the disk are performed at separate times. In view of this characteristic, in order to reduce circuit complexity and reduce power consumption, only one shared address generator need be provided. This can be accomplished by providing selector 560 to select either the user data from encoder 302 as input to address generator 510' when writing to disk 406 or an output of Soft Viterbi decoder 504' when reading from disk 406. Additionally, the output of address generator 510' is provided to an input of LDPC encoder 304' by means of selector 565 when writing to disk 406 or to an input of LDPC decoder 506 by means of selector 565 when reading from disk 406.

While the invention has been described in conjunction with several specific embodiments, it is evident to those skilled in the art that many further alternatives, modifications and variations will be apparent in light of the foregoing description. More specifically, while the present invention is preferably implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A data transmission system for transmitting user data to and receiving data from a communication channel, comprising:

a first address generator to generate a first address in accordance with the user data;

a linear block encoder to encode the user data in response to the first address from said first generator;

a transmitter to transmit an output of said linear block encoder to the communication channel;

a soft channel decoder to decode data;

a second address generator to generate a second address in accordance with the decoded data from said soft channel decoder; and a soft linear block code decoder to decode data decoded by said soft channel decoder in accordance with the second address from said second address generator.

2. A data transmission system according to claim 1, further comprising an encoder to supply encoded data to said first address generator and a decoder responsive to said soft linear block code decoder.

3. A data transmission system according to claim 2, wherein said encoder comprises a run length limited encoder and said decoder comprises a run length limited decoder.

4. A data transmission system according to claim 1, wherein said linear block encoder comprises a low-density parity-check encoder and wherein said soft linear block code decoder comprises a low-density parity-check decoder.

5. A data transmission system according to claim 1, wherein said soft channel decoder comprises a soft Viterbi algorithm decoder.

6. A data transmission system according to claim 1, wherein said first address generator comprises a first counter to count c, a position of a bit within a codeword of the user data and to count r the codeword, where r=floor(c/74).

7. A data transmission system according to claim 6, wherein said first address generator further comprises a first inner deinterleaver to deinterleave count c counted by said first counter and to output c'.

8. A data transmission system according to claim 7, wherein said first address generator further comprises a first shift circuit to shift the deinterleaved count c' by said first inner deinterleaver in accordance with count r counted by said first counter to output c''.

9. A data transmission system according to claim 8, wherein said first shift circuit shifts c' by (c'−(72-r))(mod 74).

10. A data transmission system according to claim 8, wherein said first address generator further comprises a first swap circuit to swap c'' and to output c'''.

11. A data transmission system according to claim 10, wherein said first address generator further comprises a first equation circuit to output the first address.

12. A data transmission system according to claim 11, wherein said linear block encoder utilizes a first parity check matrix having three tiers.

13. A data transmission system according to claim 12, wherein the first parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

14. A data transmission system according to claim 12, wherein said first equation circuit outputs an equation for tier 1=c''' (mod 73), the equation for tier 2=c''', and the equation for tier 3=c''' (mod 75).

15. A data transmission system according to claim 1, wherein said second address generator comprises a second counter to count c, a position of a bit within a codeword of the user data and to count r the codeword, where r=floor(c/74).

16. A data transmission system according to claim 15, wherein said second address generator further comprises a second inner deinterleaver to deinterleave count c counted by said second counter and to output c'.

17. A data transmission system according to claim 16, wherein said second address generator further comprises a second shift circuit to shift the deinterleaved count c' by said second inner deinterleaver in accordance with count r counted by said second counter to output c''.

18. A data transmission system according to claim 17, wherein said second shift circuit shifts c' by (c'−(72-r))(mod 74).

19. A data transmission system according to claim 17, wherein said second address generator further comprises a second swap circuit to swap c'' and to output c'''.

20. A data transmission system according to claim 19, wherein said second address generator further comprises a second equation circuit to output the second address.

21. A data transmission system according to claim 20, wherein said soft linear block code decoder utilizes a second parity check matrix having three tiers.

22. A data transmission system according to claim 21, wherein the second parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

23. A data transmission system according to claim 21, wherein said second equation circuit outputs an equation for tier 1=c''' (mod 73) and position bit=floor((c'''+74r)/73), the equation for tier 2=c''' and position of tier 2=r, and the equation for tier 3=c''' (mod 75) and position bit for tier 3=floor((c'''+74r)/75).

24. A data transmission system for transmitting user data to and receiving data from a communication channel, comprising:

first address generator means for generating a first address in accordance with the user data;

linear block encoding means for encoding the user data in response to the first address from said first generator means;

transmitting means for transmitting an output of said linear block encoding means to the communication channel;

soft channel decoding means for decoding data;

second address generator means for generating a second address in accordance with the decoded data from said soft channel decoding means; and soft linear block code decoding means for decoding data decoded by said soft channel decoding means in accordance with the second address from said second address generator means.

25. A data transmission system according to claim 24, further comprising encoding means to supply encoded data to said first address generator means and decoding means responsive to said soft linear block code decoding means.

26. A data transmission system according to claim 25, wherein said encoding means comprises run length limited encoding means and said decoding means comprises run length limited decoding means.

27. A data transmission system according to claim 24, wherein said linear block code encoding means comprises low-density parity-check encoding means and wherein said soft linear block decoding means comprises low-density parity-check decoding means.

28. A data transmission system according to claim 24, wherein said soft channel decoding means comprises soft Viterbi algorithm decoding means.

29. A data transmission system according to claim 24, wherein said first address generator means comprises a first counting means for counting c, a position of a bit within a codeword of the user data and for counting r the codeword, where r=floor(c/74).

30. A data transmission system according to claim 29, wherein said first address generator means further comprises a first inner deinterleaver means for deinterleaving count c counted by said first counting means and for outputting c'.

31. A data transmission system according to claim 30, wherein said first address generator means further comprises first shifting means for shifting the deinterleaved count c' by said first inner deinterleaver in accordance with count r counted by said first counting means to output c''.

32. A data transmission system according to claim 31, wherein said first shifting means shifts c' by (c'−(72-r))(mod 74).

33. A data transmission system according to claim 31, wherein said first address generator means further comprises first swapping means for swapping c'' and for outputting c'''.

34. A data transmission system according to claim 33, wherein said first address generator means further comprises a first equation means for outputting the first address.

35. A data transmission system according to claim 34, wherein said linear block encoding means utilizes a first parity check matrix having three tiers.

36. A data transmission system according to claim 35, wherein the first parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

37. A data transmission system according to claim 35, wherein said first equation means outputs an equation for tier 1=c''' (mod 73), the equation for tier 2=c''', and the equation for tier 3=c''' (mod 75).

38. A data transmission system according to claim 34, wherein said second address generator means comprises a second counting means for counting c, a position of a bit within a codeword of the user data and for counting r the codeword, where r=floor(c/74).

39. A data transmission system according to claim 38, wherein said second address generator means further comprises second inner deinterleaver means for deinterleaving count c counted by said second counting means and for outputting c'.

40. A data transmission system according to claim 39, wherein said second address generator means further comprises second shifting means for shifting the deinterleaved count c' by said second inner deinterleaver means in accordance with count r counted by said second counting means to output c''.

41. A data transmission system according to claim 40, wherein said second shifting means shifts c' by (c'−(72-r)) (mod 74).

42. A data transmission system according to claim 40, wherein said second address generator means further comprises second swapping means for swapping c'' and for outputting c'''.

43. A data transmission system according to claim 42, wherein said second address generator means further comprises second equation means for outputting the second address.

44. A data transmission system according to claim 43, wherein said soft linear block code decoding means utilizes a second parity check matrix having three tiers.

45. A data transmission system according to claim 44, wherein the second parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

46. A data transmission system according to claim 44, wherein said second equation means outputs an equation for tier 1=c''' (mod 73) and position bit=floor((c'''+74r)/73), the equation for tier 2=c''' and position of tier 2=r, and the equation for tier 3=c''' (mod 75) and position bit for tier 3=floor((c'''+74r)/75).

47. A method for transmitting data to and receiving data from a communication channel, comprising the steps of:

(a) generating an address in accordance with the data to be transmitted to the communication channel;

(b) linear block encoding the data in accordance with the address generated in step (a);

(c) transmitting the data encoded in step (b) to the communication channel;

(d) receiving the data from the communication channel;

(e) soft channel decoding the data read in step (d) in accordance with data decoded in step (g);

(f) generating an address in accordance with the data decoded in step (e); and (g) soft linear block code decoding data decoded in step (e) in accordance with the address generated in step(f).

48. A method according to claim 47, further comprising the steps of (a')encoding the data prior to step (a) and (h) decoding the data decoded in step (g).

49. A method according to claim 48, wherein step (a') comprises the step of run length limited encoding and wherein step (h) comprises the step of run length limited decoding.

50. A method according to claim 47, wherein step (b) comprises the step of low-density parity-check encoding and wherein step (g) comprises the step of soft low-density parity-check decoding.

51. A method according to claim 47, wherein step (e) comprises the step of soft Viterbi algorithm decoding.

52. A method according to claim 47, wherein in step (a) further comprises the step (a1) counting c, a position of a bit within a codeword of the user data and counts r the codeword, where r=floor(c/74).

53. A method according to claim 52, wherein step (a) further comprises the step of (a2) deinterleaving c counted in step (a1) to output c'.

54. A method according to claim 53, wherein step (a) further comprises the step of (a3) shifting c' from step (a2) in accordance with r counted in step a1 to output c".

55. A method according to claim 54, wherein step (a3) shifts c' by (c'−(72-r))(mod 74).

56. A method according to claim 54, wherein step (a) further comprises the step of (a4) swapping c" to output c'".

57. A method according to claim 47, wherein step (b) utilizes a first parity check matrix having three tiers.

58. A method according to claim 57, wherein the first parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

59. A method according to claim 57, wherein step (a) further comprises the steps of:

(a5) outputting an equation for tier 1=c'"(mod 73);

(a6) outputting an equation for tier 2=c'"; and (a7) outputting an equation for tier 3=c'"(mod 75).

60. A method according to claim 47, wherein in step (f) further comprises the step (f1) counting c, a position of a bit within a codeword of the user data and counts r the codeword, where r=floor(c/74).

61. A method according to claim 60, wherein step (f) further comprises the step of (f2) deinterleaving c counted in step (f1) to output c'.

62. A method according to claim 61, wherein step (f) further comprises the step of (f3) shifting c' from step (f2) in accordance with r counted in step (f1) to output c".

63. A method according to claim 62, wherein step (f3) shifts c' by (c'−(72-r))(mod 74).

64. A method according to claim 62, wherein step (f) further comprises the step of (f4) swapping c" to output c'".

65. A method according to claim 47, wherein step (f) utilizes a second parity check matrix having three tiers.

66. A method according to claim 65, wherein the second parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

67. A computer program embodied in a medium for transmitting data to and receiving data from a communication channel, comprising the steps of:

(a) generating an address in accordance with the data to be transmitted to the communication channel;

(b) linear block encoding the data in accordance with the address generated in step (a);

(c) transmitting the data encoded in step (b) to the communication channel;

(d) receiving the data from the communication channel;

(e) soft channel decoding the data read in step (d) in accordance with data decoded in step (g);

(f) generating an address in accordance with the data decoded in step (e); and (g) soft linear block code decoding data decoded in step (e) in accordance with the address generated in step(f).

68. A computer program according to claim 67, further comprising the steps of (a')encoding the data prior to step (a) and (h) decoding the data decoded in step (g).

69. A computer program according to claim 68, wherein step (a') comprises the step of run length limited encoding and wherein step (h) comprises the step of run length limited decoding.

70. A computer program according to claim 67, wherein step (b) comprises the step of low-density parity-check encoding and wherein step (g) comprises the step of soft low-density parity-check decoding.

71. A computer program according to claim 67, wherein step (e) comprises the step of soft Viterbi algorithm decoding.

72. A computer program according to claim 67, wherein in step (a) further comprise step (a1) counting c, a position of a bit within a codeword of the user data and counts r the codeword, where r=floor(c/74).

73. A computer program according to claim 72, wherein step (a) further comprises step of (a2) deinterleaving c counted in step (a1) to output c'.

74. A computer program according to claim 73, wherein step (a) further comprises step of (a3) shifting c' from step (a2) in accordance with r counted in step a1 to output c".

75. A computer program according to claim 74, wherein step (a3) shifts c' by (c'−(72-r)(mod 74).

76. A computer program according to claim 74, wherein step (a) further comprises the step of (a4) swapping c" to output c'".

77. A computer program according to claim 67, wherein step (b) utilizes a first parity check matrix having three tiers.

78. A computer program according to claim 77, wherein the first parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

79. A computer program according to claim 77, wherein step (a) further comprises the steps of:

(a5) outputting an equation for tier 1=c'"(mod 73);

(a6) outputting an equation for tier 2=c'"; and (a7) outputting an equation for tier 3=c'"(mod 75).

80. A computer program according to claim 67, wherein in step (f) further comprises the step (f1) counting c, a position of a bit within a codeword of the user data and counts r the codeword, where r=floor(c/74).

81. A computer program according to claim 80, wherein step (f) further comprises the step of (f2) deinterleaving c counted in step (f1) to output c'.

82. A computer program according to claim 81, wherein step (f) further comprises the step of (f3) shifting c' from step (f2) in accordance with r counted in step (f1) to output c".

83. A computer program according to claim 82, wherein step (f3) shifts c' by (c'−(72-r))(mod 74).

84. A method according to claim 82, wherein step (f) further comprises the step of (f4) swapping c" to output c'".

85. A computer program according to claim 67, wherein step (f) utilizes a second parity check matrix having three tiers.

86. A computer program according to claim 85, wherein the second parity check matrix comprises the following values:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75). |

* * * * *